US012299351B2

(12) United States Patent
Ginsberg

(10) Patent No.: US 12,299,351 B2
(45) Date of Patent: May 13, 2025

(54) COMPUTER-AIDED DESIGN SYSTEM FOR AIRBORNE CONTAMINANT FLOWS

(71) Applicant: United States of America as Represented by The Secretary of The Army, Alexandria, VA (US)

(72) Inventor: Mark D Ginsberg, Champaign, IL (US)

(73) Assignee: UNITED STATES OF AMERICA AS REPRESENTED BY THE SECRETARY OF THE ARMY, Alexandria, VA (US)

( * ) Notice: Subject to any disclaimer, the term of this patent is extended or adjusted under 35 U.S.C. 154(b) by 0 days.

(21) Appl. No.: 18/373,215

(22) Filed: Sep. 26, 2023

(65) Prior Publication Data

US 2024/0020432 A1 Jan. 18, 2024

Related U.S. Application Data

(63) Continuation of application No. 16/146,941, filed on Sep. 28, 2018, now abandoned.

(51) Int. Cl.

| | |
|---|---|
| ***G06F 30/13*** | (2020.01) |
| ***F24F 7/007*** | (2006.01) |
| ***F24F 11/72*** | (2018.01) |
| ***G05B 13/04*** | (2006.01) |
| ***G06F 17/10*** | (2006.01) |

(52) U.S. Cl.
CPC .............. *G06F 30/13* (2020.01); *F24F 7/007* (2013.01); *F24F 11/72* (2018.01); *G05B 13/048* (2013.01); *G06F 17/10* (2013.01)

(58) Field of Classification Search
CPC .......... G06F 30/20; G06F 30/23; G06F 30/13; G06F 17/10; G06F 30/28; G06F 30/15; G06F 30/25; F24F 7/007; F24F 11/72; F24F 2110/64; G05B 13/048; Y02B 30/70
See application file for complete search history.

(56) References Cited

PUBLICATIONS

Kyriacou et al. "Distributed Contaminant Detection and Isolation for Intelligent Buildings" IEEE Transactions on Control Systems Technology, vol. 26, No. 6, Nov. 2018 (Published Oct. 12, 2017) [retrieved on Sep. 19, 2024] (Year: 2017).*

* cited by examiner

*Primary Examiner* — Juan C Ochoa
*Assistant Examiner* — Alfred H B Wechselberger
(74) *Attorney, Agent, or Firm* — Brian C. Jones

(57) ABSTRACT

Disclosed is a computer-aided design system that incorporates an airborne contaminant-flow calculator. In designing a new architectural structure, or modifying an existing one, the calculator informs the architect of the airflow ramifications of the design as the design is created or modified. The calculator uses a closed-form solution for calculating the airflow in order to present its results in a timely fashion.

33 Claims, 13 Drawing Sheets

200

300

400

COMPUTER-AIDED DESIGN SYSTEM FOR AIRBORNE CONTAMINANT FLOWS

CROSS-REFERENCE TO RELATED APPLICATIONS

The present application is related to U.S. Pat. No. 10,907,847, which is incorporated herein in its entirety by reference.

FEDERALLY SPONSORED RESEARCH OR DEVELOPMENT

Under paragraph 1(a) of Executive Order 10096, the conditions under which this invention was made entitle the Government of the United States, as represented by the Secretary of the Army, to an undivided interest therein on any patent granted thereon by the United States. This and related patents are available for licensing to qualified licensees.

BACKGROUND

Field of the Invention

The present disclosure is related generally to computer-aided design systems and, more particularly, to using such systems to design for airborne contaminant flows.

Description of the Related Art

This section introduces aspects that may help facilitate a better understanding of the invention. Accordingly, the statements of this section are to be read in this light and are not to be understood as admissions about what is prior art or what is not prior art.

Ideally, architectural structures are designed to prevent or to minimize the spread of airborne contaminants. Some such contaminants may be deliberately introduced by acts of terrorism as the anthrax attacks of 2001 illustrated. Even in peacetime, proper architectural design can decrease the spread of chemical or biological contaminants and thus reduce the effects of "sick building syndrome."

BRIEF SUMMARY

To address the issue of airborne contaminant flows, a computer-aided design system incorporates a contaminant-flow calculator. In designing a new architectural structure, or modifying an existing one, the calculator informs the architect of the airflow ramifications of the design as the design is created or modified. The calculator uses a closed-form solution for calculating the airflow in order to present its results in a timely fashion.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

DETAILED DESCRIPTION

Figure 1:
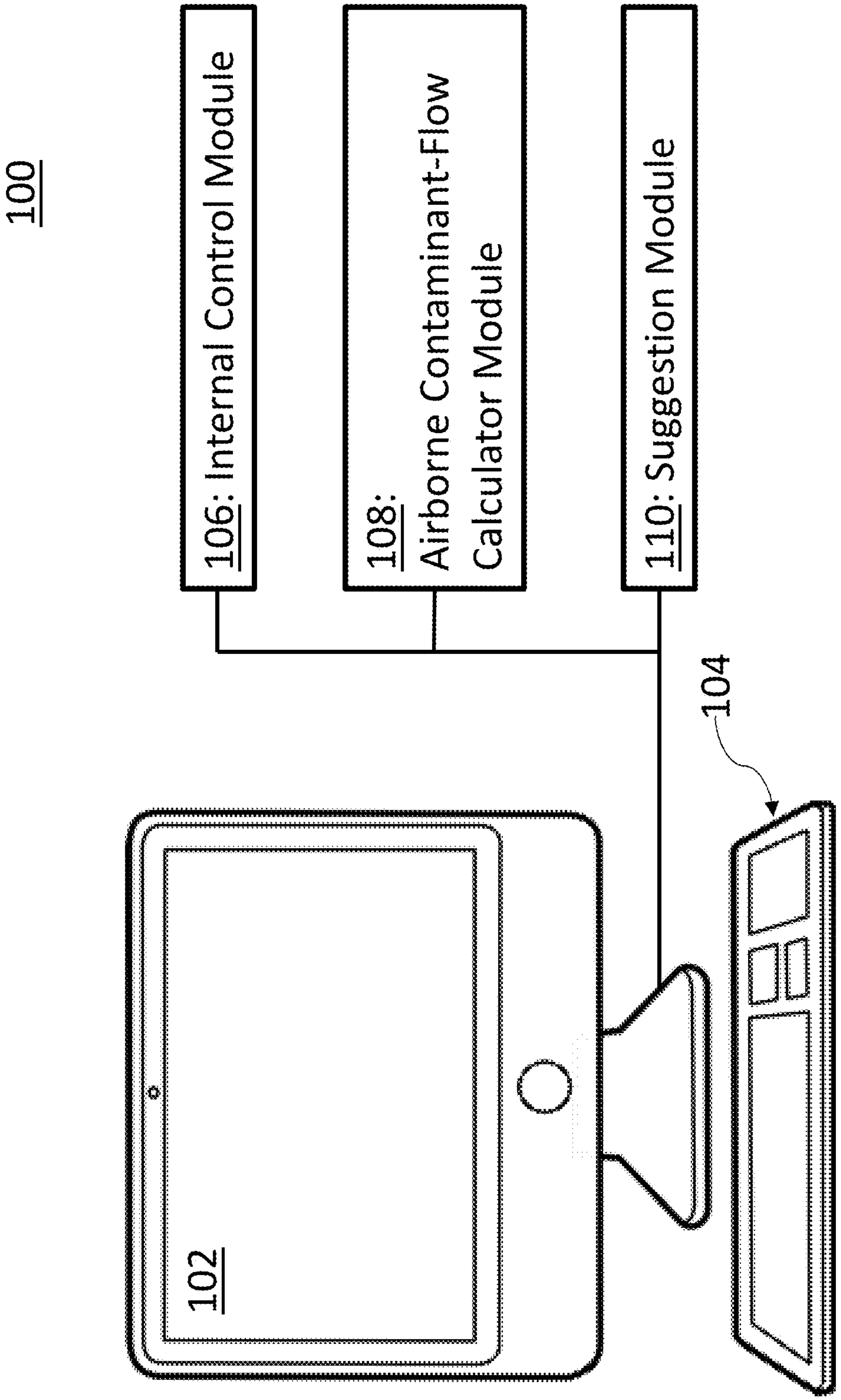
FIG. 1 is a generalized schematic of a representative computer-aided design environment in which the present techniques may be practiced.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the" are intended to include the plural forms as well, unless the context clearly indicates otherwise. It further will be understood that the terms "comprises," "comprising," "includes," and "including" specify the presence of stated features, steps, or components but do not preclude the presence or addition of one or more other features, steps, or components. It also should be noted that in some alternative implementations, the functions and acts noted may occur out of the order noted in the figures. For example, two figures shown in succession may in fact be executed substantially concurrently or may sometimes be executed in the reverse order, depending upon the functionality and acts involved.

Designing (or redesigning) architectural structures to protect their occupants from airborne contaminants is a known priority. Clearly, access to safe air is a life-safety issue, yet it has been difficult to achieve protection from airborne contaminants once those contaminants are drawn into a structure's heating, ventilation, and air-conditioning ("HVAC") system. This difficulty arises from a combinatorial explosion of different technical problems.

One of these problems involves the calculating of exposure levels for the structure's occupants under various scenarios. The problem can be stated in terms of systems of ordinary differential equations which can be addressed by matrix-inversion methods. However, traditional methods for calculating a solution to those systems become slow and unwieldy as the structure increases in both number of rooms and in the number of HVAC zones. Unfortunately for the sake of quick calculations, typical buildings have many HVAC zones and many rooms per zone. Even structures as small as a mobile home require many minutes of computer simulation to analyze the first few minutes of a simulated exposure to biological or chemical contaminants.

Thus, meaningful feedback on exposure was not often provided to the structure's designer. Exposure levels were only calculated for situations where bio-protection was utterly imperative (e.g., military installations and some hospital operating rooms). Even then, the calculations would serve only as a single final check on the structural design and would not contribute much to the design process itself. Additionally, calculating exposure levels during a real-time response to a contamination incident was unheard of.

The techniques of the present disclosure address these and other issues. By incorporating a near real-time calculator of airborne contaminant flows, a novel computer-aided design ("CAD") system provides designers with useful feedback during the architectural design (or re-design) process. The designer, or the CAD system itself, uses that feedback to improve a structure's response to contaminant flows. Because the calculator uses so few computer resources, it can be repeatedly invoked to test novel design features thus enabling a fuller expression of the designer's creativity.

Turning now to the figures, FIG. 1 schematically presents a CAD system 100 that incorporates the techniques of the present disclosure. A typical CAD system 100 is quite a complicated device, but as the bulk of that complication is well known in the art, the present discussion focuses on the novel aspects introduced by the present disclosure.

When beginning to work on a new architectural structure, be that structure a building, a vehicle (boat, submarine, airplane, spaceship), a space station, or whatever, the designer uses the CAD system 100 to collect and organize his thinking about the developing design. The designer submits new elements and modifications via any of numerous input devices 104 supported by the CAD system 100 and receives feedback via any of numerous output devices 102. For example, the designer views the design-in-progress of a building layout on a computer screen 102, uses the computer pointing device 104 or a touchscreen 102/104 to change the layout by adding a door, and then views the resulting design on the screen 102. Other uses of the CAD system's input/output devices are called out below where appropriate.

Driving the CAD system 100 is an internal control module 106, typically one or more microprocessors working together. The internal control module 106 controls the output devices 102, receives information from the input devices 104, and stores the developing design in short-term and long-term memories (not shown but well known in the art).

The internal control module 106 also contains logic (not shown but well known in the art) to present aspects of the developing design in different ways to help the designer understand how all parts of a complicated structure work together. This is useful not only when developing a design for a new structure but for helping to understand an existing structure.

Other well known aspects of logic implemented by the internal control module 106 ensure that the design is a rational whole and check the developing design against applicable standards. Some of standards vary depending upon the purpose of the structure. As can be well imagined, air-filtration requirements differ for an industrial meat locker, a hospital operating room, and a hotel meeting room.

In some embodiments of the CAD system 100, various checks are performed automatically when a proposed modification may implicate an important aspect of the structure. For example, the CAD system 100 may automatically re-test structural integrity when a load-bearing wall is breached by a proposed modification. If the designer changes the anticipated number of occupants of a building, then the CAD system 100 may ensure that the modified design still meets all fire-code regulations by having an adequate sprinkler system and enough emergency-exit doors for the anticipated number of occupants.

In other situations, the standards-checking may involve calculations so onerous that instead of being invoked automatically, they are only invoked at the direction of the designer when the developing design reaches substantial progress points.

In some embodiments, the present disclosure adds two new aspects to a traditional CAD system 100. These are denoted in FIG. 1 as the "Airborne Contaminant-Flow Calculator Module" 108 and the "Suggestion Module" 110. While these new modules 108, 110 are fully integrated into the CAD system 100, their particular contributions are best understood in relation to the flowcharts of FIGS. 2 and 3 and in relation to the illustrations of a developing design for a building as shown in FIGS. 4*a*, 4*b*, and 4*c*.

Figure 2:
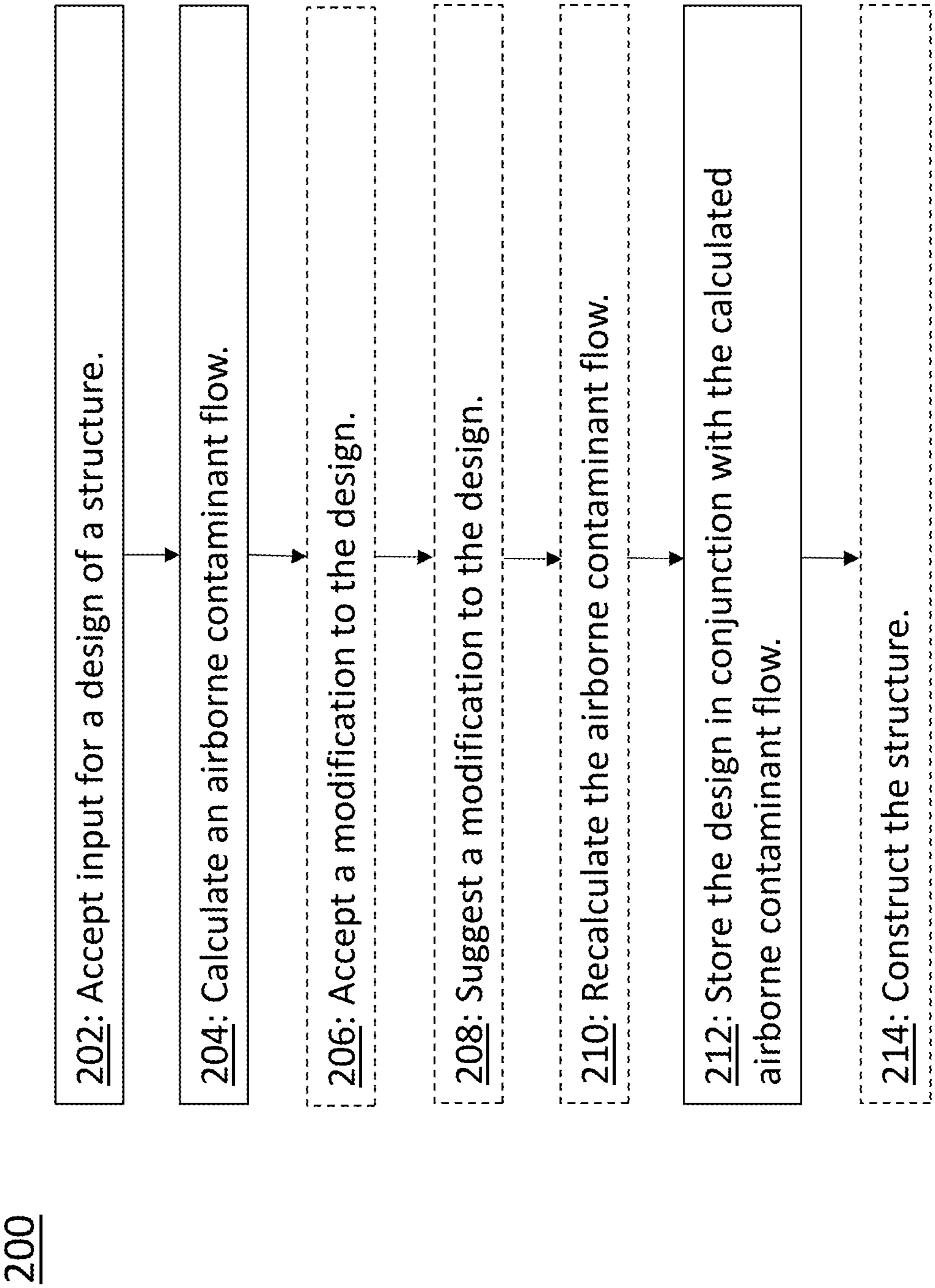
FIG. 2 is a flowchart of a representative method for designing an architectural structure.

The flowchart of FIG. 2 presents an exemplary method 200 for designing an architectural structure. The method 200 begins in step 202 when design information for the structure is entered into the CAD system 100. Of particular importance to the present discussion are any details that may influence the flow of air throughout the structure. Clearly, such details include the purpose and size of the structure, the capacity (as variously measured) of the structure's HVAC systems, and the number and size of apertures (doors and windows) that may be opened to connect the structure's inner environment with that of the outside. Other details may be important but less obvious such as the weather (temperature ranges and wind speeds) expected at the location where the structure is to "reside" and any special concerns about airborne contamination that the structure's expected occupants may have.

However the structural information was gathered in step 202, and however complete or sketchy that information is, that structural information is used by the airborne contaminant-flow calculator module 108 to create a model showing how air is expected to flow throughout the structure as the structure is currently designed (step 204).

As mentioned above, such airflow calculations were traditionally performed using extensive numerical modeling. Such modeling was both very expensive and very slow. An airflow model for a moderately-sized building would consume hours or even days of computer time. While the results are very useful and important, those methods were much too slow to provide near real-time feedback to a designer contemplating a modification to the structure's design. Thus, these airflow calculations were only invoked at the end of the design process to verify that the structure as completely designed met whatever applicable standards and design goals were set when the structure was first contemplated.

Another result of the extremely high costs (in terms of both time and dollars) of numerical methods is "over-specification" of HVAC system performance for critical facilities. Because it was so difficult to calculate the actual airflow requirements, it was safest to assume a worst case scenario and then specify the most capable HVAC filtration system available. As just one example, the United States federal government was justly concerned about terrorists intentionally introducing airflow contaminants, so it specified very expensive HEPA filtering for many of its installations, which led to costs in replaceable filters and electricity of hundreds of thousands of dollars per year per installation.

Now, however, recently developed closed-form solutions can be applied to many airborne contaminant scenarios. In many embodiments, the airborne contaminant-flow calculator 108 uses one or more closed-form solutions in step 204 and thus provides near real-time feedback to the designer.

Turn now to FIG. 4*a* which represents a very early stage 400 in the design of a building. Because this "Ideal Building" design is so simple, so is its HVAC system. The variables in FIG. 4*a* represent:

R rate of ventilation in the building;

$\eta$ fraction of air recirculated, implies $(1-\eta)$ is the fraction of "makeup air;"

$T_{OA}$ transmittance of the outdoor air filter at a fixed particle size;

$T_{IA}$ transmittance of the indoor air filter at a fixed particle size; and $V_I$ volume of the building's interior.

It is useful to calculate the airflow even at this very early stage in the development of the building's design, producing baseline results to which later stages in the design are compared. The airborne contaminant-flow calculator 108 does that and produces the results shown in FIGS. 5 and 6.

Figure 5A:
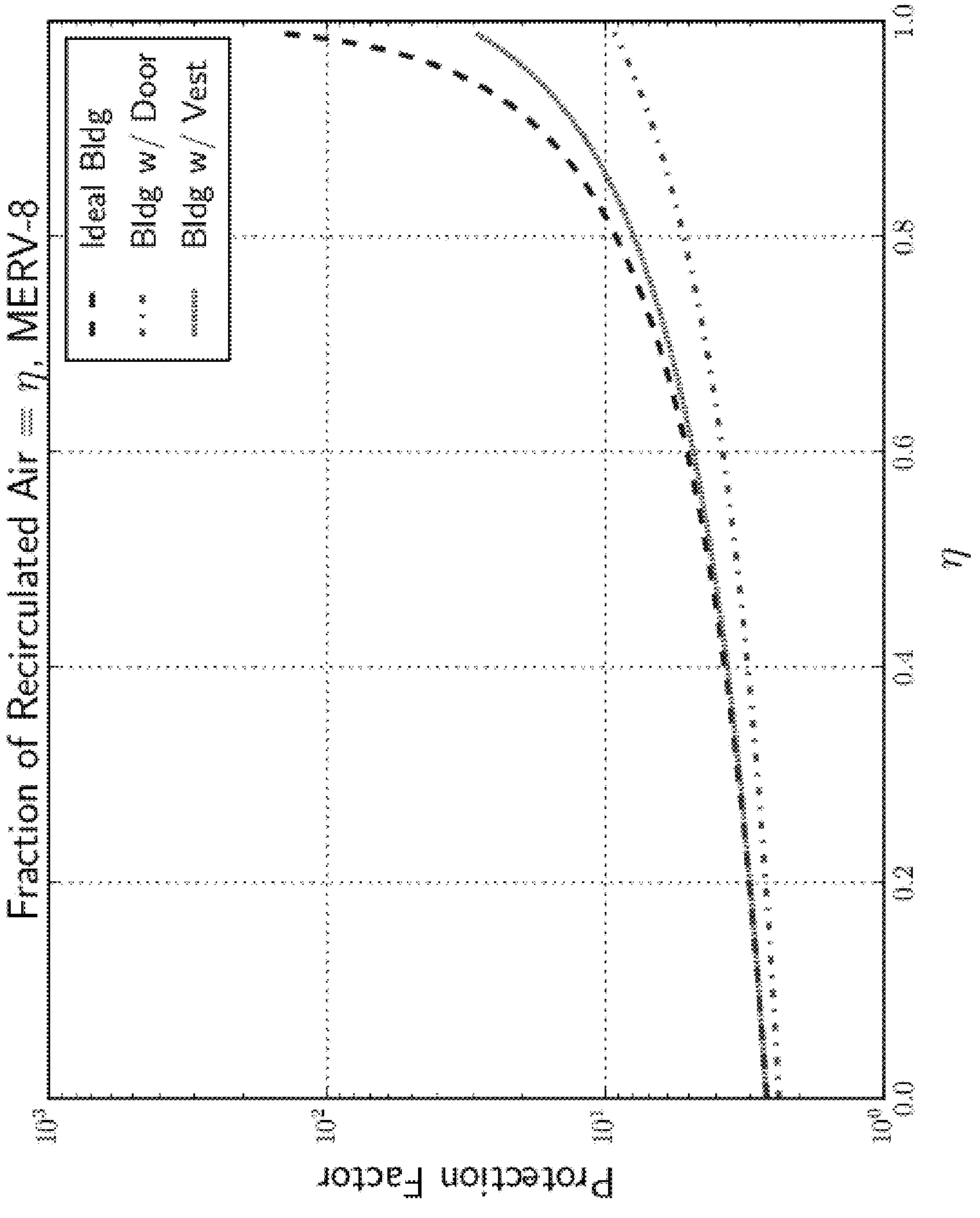
FIGS. 5*a*, 5*b*, and 5*c* are the results of calculations with a Minimum Efficiency Reporting Value ("MERV") 8 filter for various stages in the design of the building of FIG. 4.

For the moment considering only the curve labelled "Ideal Building," FIG. 5*a* shows the calculated "Protection Factor" as a function of q, the fraction of air recirculated, when a MERV-8 filter is installed.

Note on the "Protection Factor:" This is one result of the contaminant-flow calculations, and it summarizes how good the structure under test will be at protecting its proposed occupants from airborne contaminants, whether those contaminants are intentionally introduced in an act of terrorism or unintentionally introduced (e.g., pollen or other allergens sucked into the building through the outdoor air filter at Top, or chemicals outgassed by a "sick building"). The exact interpretation of the Protection Factor depends upon the specifics of the methods used to calculate it other than the general observation that "higher numbers are better." For exemplary details usable in some embodiments, see the Notes on a Closed-Form Solution for Airborne Contaminant Flows below and, especially, the article "Bioprotection of Facilities" cited therein where the Protection Factor is defined as "the asymptotic ratio of outdoor-to-indoor air concentration of particulate matter when the outdoor air is held at a fixed contaminant concentration." The techniques disclosed herein are not tied to any particular method for calculating the airflow nor to any particular definition of the Protection Factor.

Figure 4A:
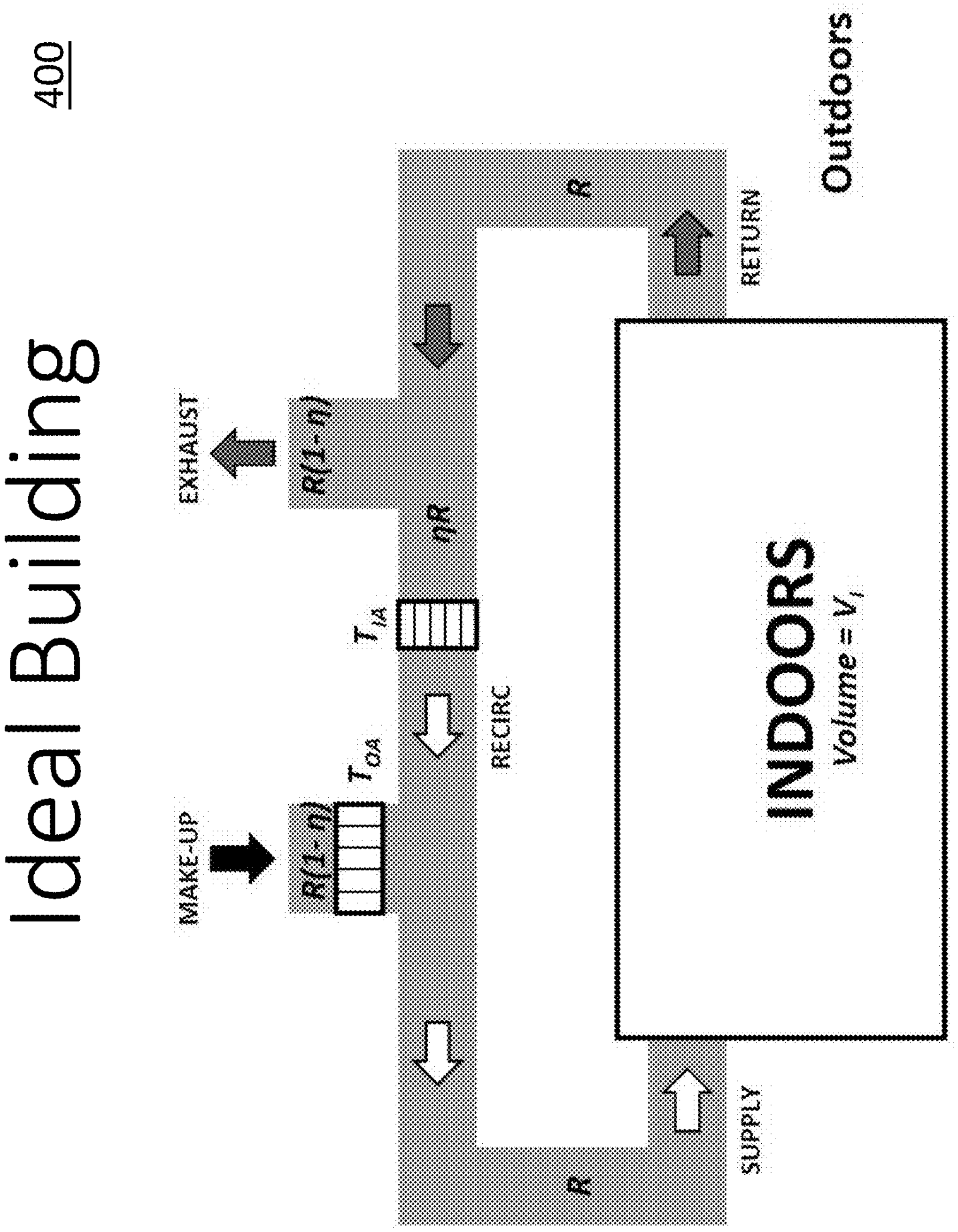
FIGS. 4*a*, 4*b*, and 4*c* are schematic drawings of a developing design for a representative building.
Figure 5B:
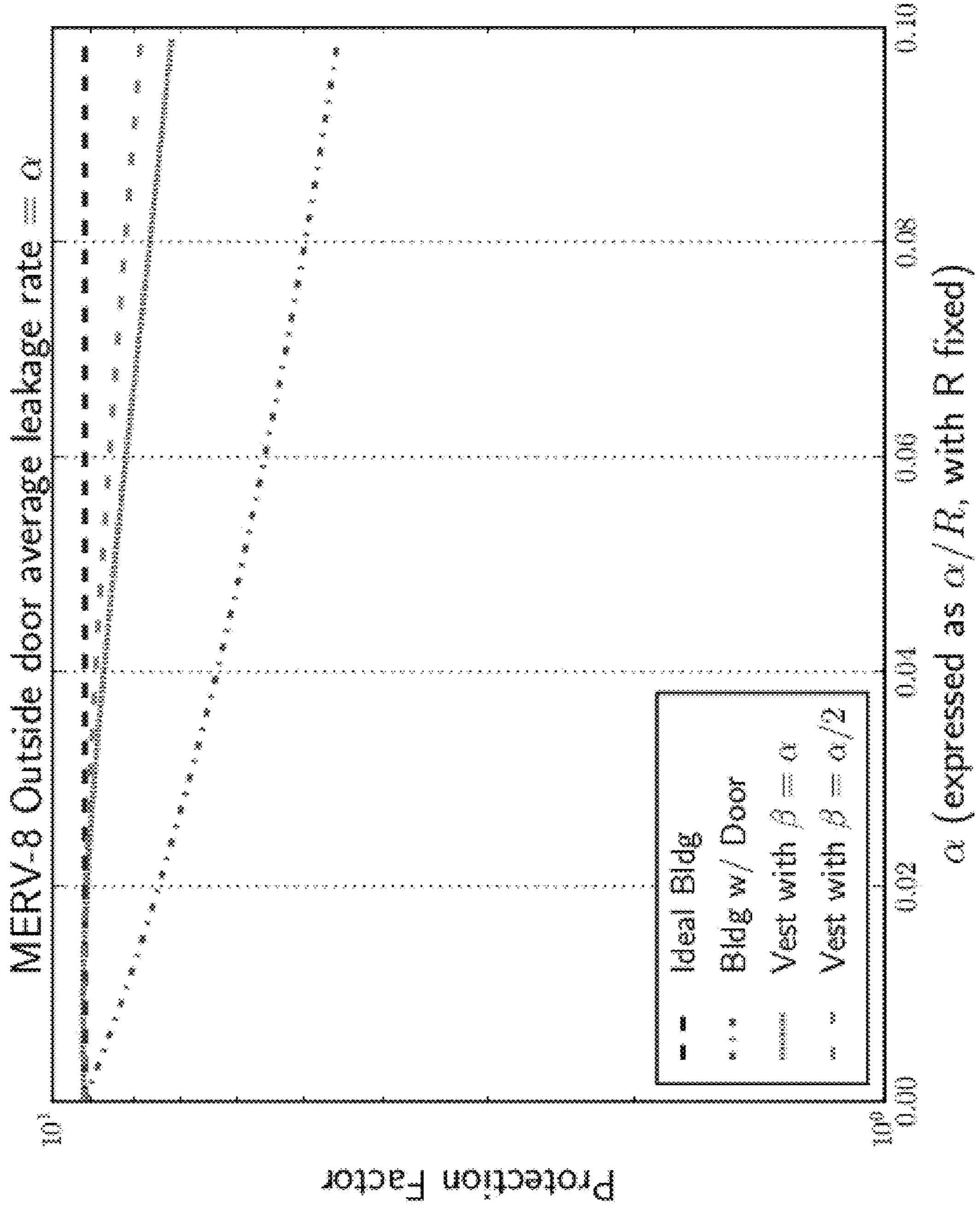
Figure 5C:
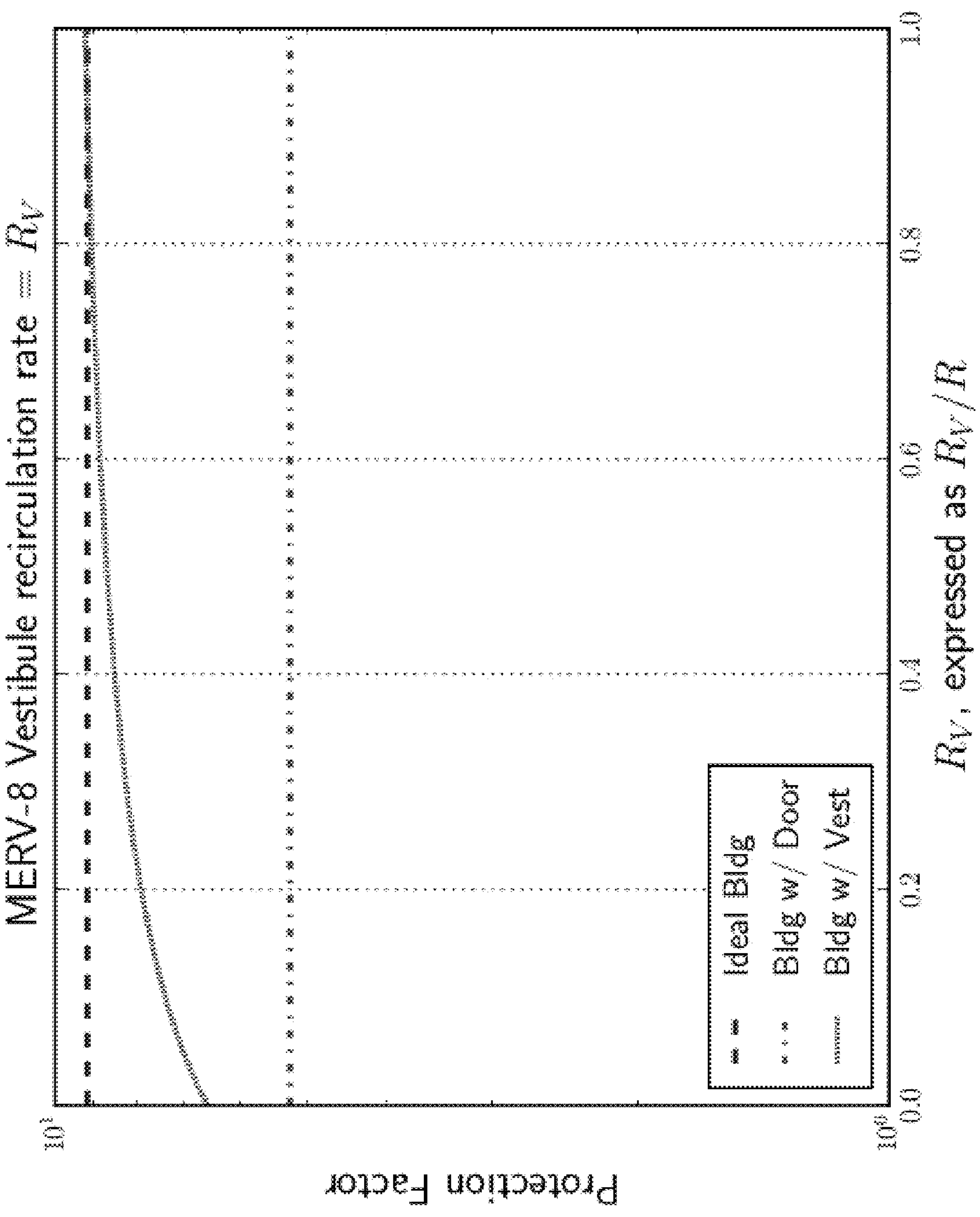
Figure 6A:
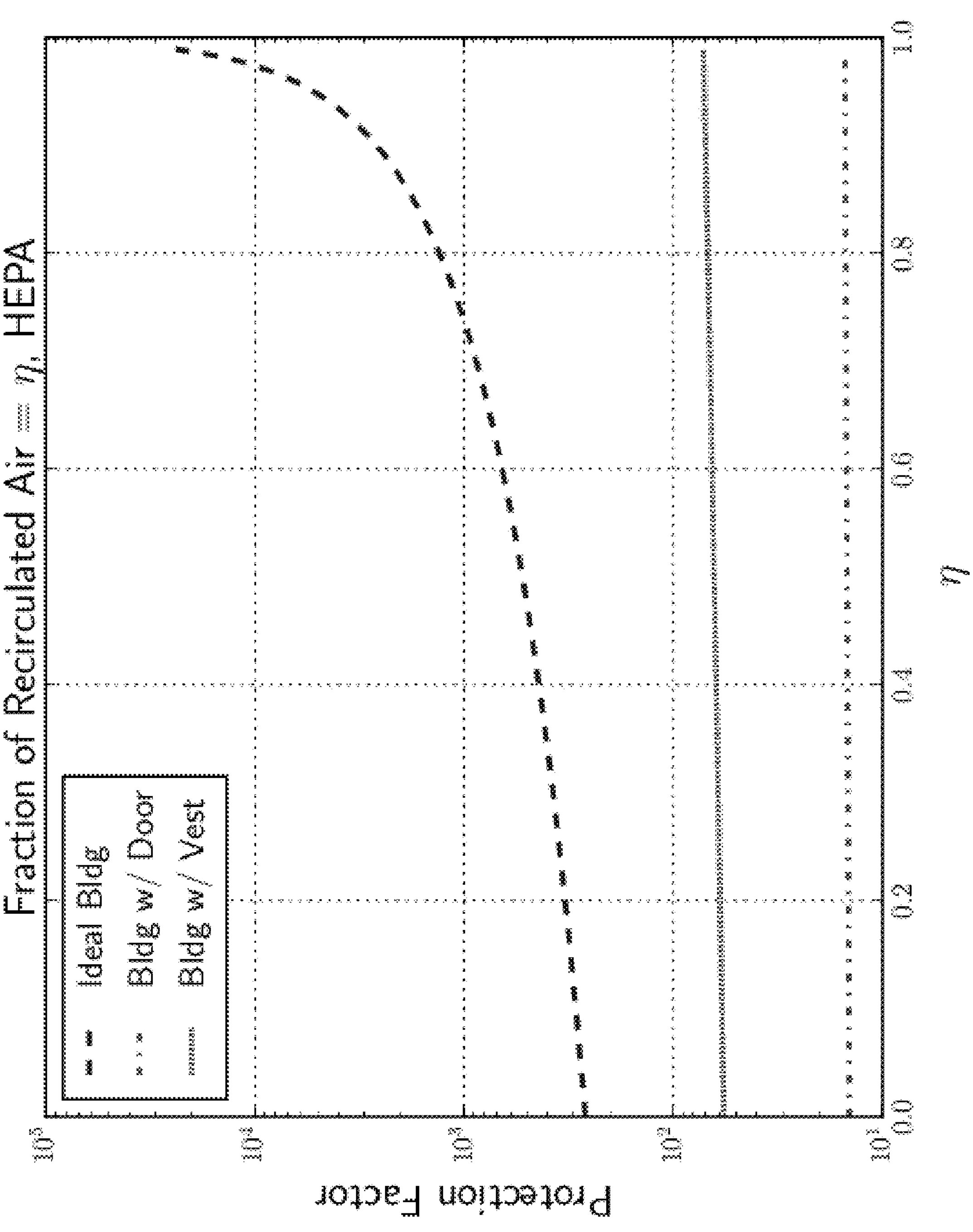
FIGS. 6*a*, 6*b*, and 6*c* are the results of calculations with a High-Efficiency Particulate Air ("HEPA") filter for various stages in the design of the building of FIG. 4.

The charts of FIGS. 5*b* and 5*c* do not apply in any very meaningful way to the "Ideal Building" of FIG. 4*a*. However, compare the "Ideal Building" curve on the chart of FIG. 5*a* with the similarly labelled curve on the chart of FIG. 6*a*. In FIG. 6*a*, a HEPA filter replaces the MERV-8 filter of FIG. 5*a*, and a comparison of the figures shows just how much better the HEPA filter performs than the MERV-8 for the building at this early stage in its design. Because of the speed of the airborne contaminant-flow calculator 108, this comparison information is available immediately to the designer who may, for instance, decide whether the better performance of the HEPA filter is worth its added expense. More likely, this early-stage comparison is stored and set aside to be revisited as the design of the building progresses.

Returning to the method 200 of FIG. 2, the designer modifies the design in step 206 and submits the modification to the CAD system 100. All types of modifications are contemplated here such as adding, removing, moving, resizing, or modifying any "architectural element." Again, all types of "architectural elements" are contemplated, but the ones of greatest interest here are the elements that can affect airflows within the structure such as windows, doors, floors, ceilings, walls, rooms, vestibules, coverings for the wall, floor, or ceiling, or parts of the structure's HVAC system.

In some embodiments, the CAD system 100 analyzes the proposed modification and, if it seems appropriate, may decide to recalculate the airflow in step 210. (Step 208, skipped for now, is discussed below.) Only certain modifications would cause the CAD system 100 to take this action: Changing the color of an inside wall probably would not trigger the recalculation while changing the color of an outside wall or the roof may, as would adding a door or another room.

Indeed, turn to FIG. 4*b* where the designer just added an outside door to the "Ideal Building" of FIG. 4*a*. This stage 402 of the emerging design introduces the following complexity to the airflow calculations:

$\alpha$ current leakage rate due to the outside door.

Because this addition clearly affects the airflow of the proposed building, the CAD system 100 recalculates the airflow in step 210 using assumptions (possibly provided directly by the designer) about how often the new door will be opened, how much air leakage occurs for each opening, and the like.

Figure 6B:
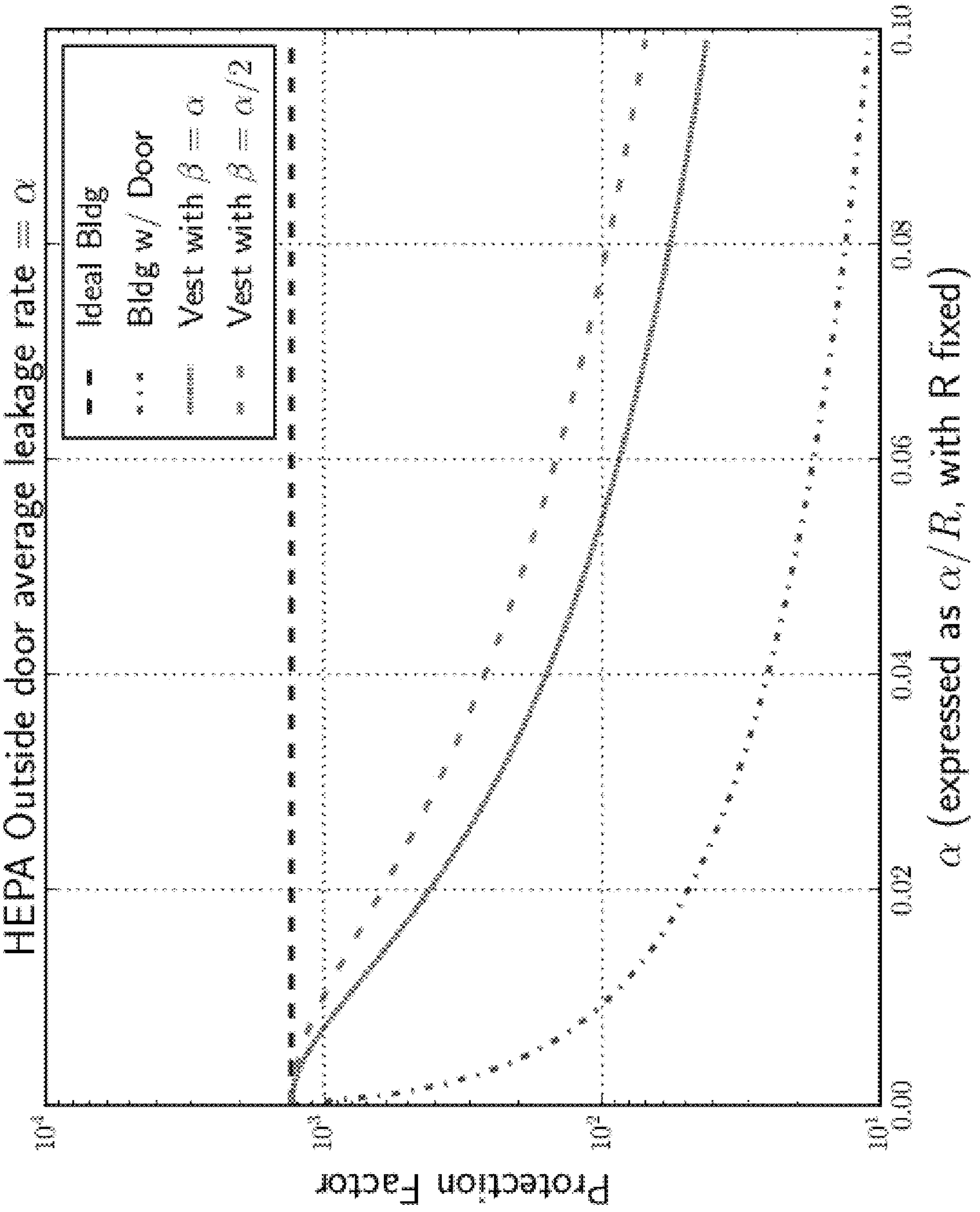

Returning to FIG. 5*a*, the curve for the present state 402 of the structure is entitled "Bldg w/ Door." A quick glance shows how much the Protection Factor is decreased by this door. FIG. 5*b* tells much the same story, this time showing how the Protection Factor depends upon the amount of leakage introduced by the new door. FIGS. 6*a* and 6*b* duplicate the analysis of FIGS. 5*a* and 5*b*, respectively, but with HEPA filters installed instead of MERV-8s.

In general, by reviewing all of these graphs, the designer compares the newly calculated airflow against that made in step 204 for the base case "Ideal Building." The designer immediately sees the consequence of adding the new door and may decide whether or not the convenience of the new door is worth the decrease in the Protection Factor that it causes.

In some embodiments, the CAD system 100 itself compares the new vs. the old airflow calculations and, if the Protection Factor is too adversely affected by a modification, may alert the designer to that fact. Fully informed by all of the airflow calculations, the designer then decides on an appropriate course of action.

As a final stage of this example, the designer adds a vestibule (design stage 404, FIG. 4*c*). Now the airflow calculation takes into consideration the following additional factors:

$\beta$ current leakage rate due to the vestibule door;

$R_v$ rate of ventilation in the vestibule;

$T_v$ transmittance of the vestibule air filter at a fixed particle size; and $V_v$ volume of the vestibule.

Figure 6C:
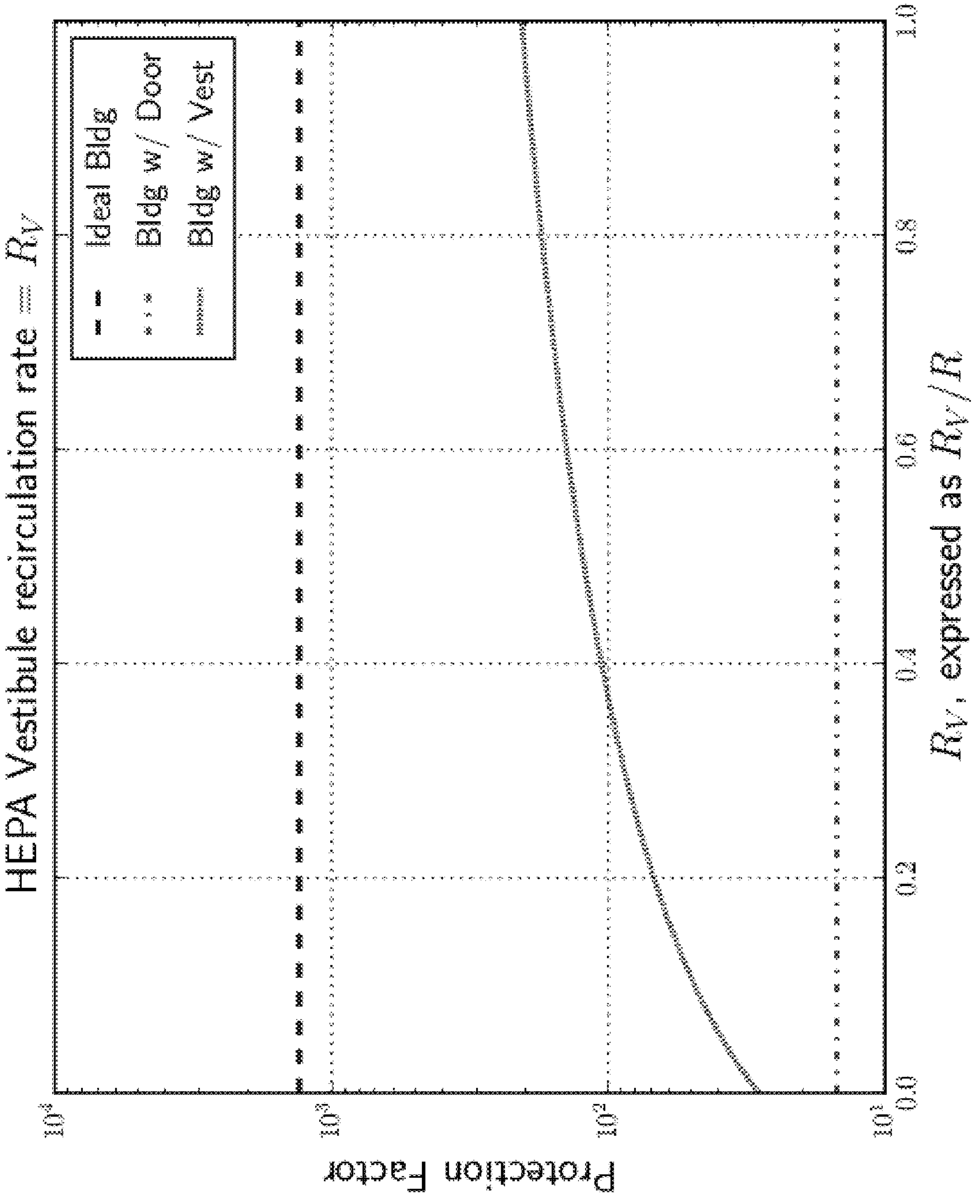

For the resulting changes to the airflow, see the charts in FIGS. 5*a*, 5*b*, and 5*c* (MERV-8 filter) and in FIGS. 6*a*, 6*b*, and 6*c* (HEPA filter).

This procedure of modifying the design and automatically recalculating the airflow and the Protection Factor continues until the final design stage is reached. At that point, the final design is stored in conjunction with the final airflow calculations (step 212) and the structure may be build according to the design (step 214).

In the above scenario, it was the CAD system 100 that decides to recalculate the airflow in step 210. In many embodiments, the designer has the option of deciding to call for a recalculation at any time.

Some embodiments of the CAD system 100 provide another intriguing feature. In the discussion so far, the airflow calculations, whether invoked by the designer or by the CAD system 100 itself, are presented to the designer and stored in conjunction with the developing design. The next feature, embodied in the "Suggestion Module" 110 of FIG. 1, reviews the proposed modifications and the resulting airflow calculations and then makes its own suggestion for improving the design. For example, when the designer suggests adding the door of FIG. 4*b*, the suggestion module

110 may suggest that a different location for the door will improve the Protection Factor significantly. The designer makes the final decision.

The suggestion module 110 bases its suggestions in part on the quick production of calculations provided by the airborne contaminant-flow calculator 108. In an advanced embodiment, the suggestion module 110 automatically introduces follow-on modifications (or alerts the designer that such follow-on modifications may be necessary) whenever the designer modifies the design. As a simple example, if the designer increases the number of occupants anticipated in the building, then the suggestion module 110 may automatically increase the air-conditioning capacity of the HVAC system. It may also alert the designer that more bathrooms may be needed and may provide suggestions as to good locations for those additional bathrooms.

Figure 3:
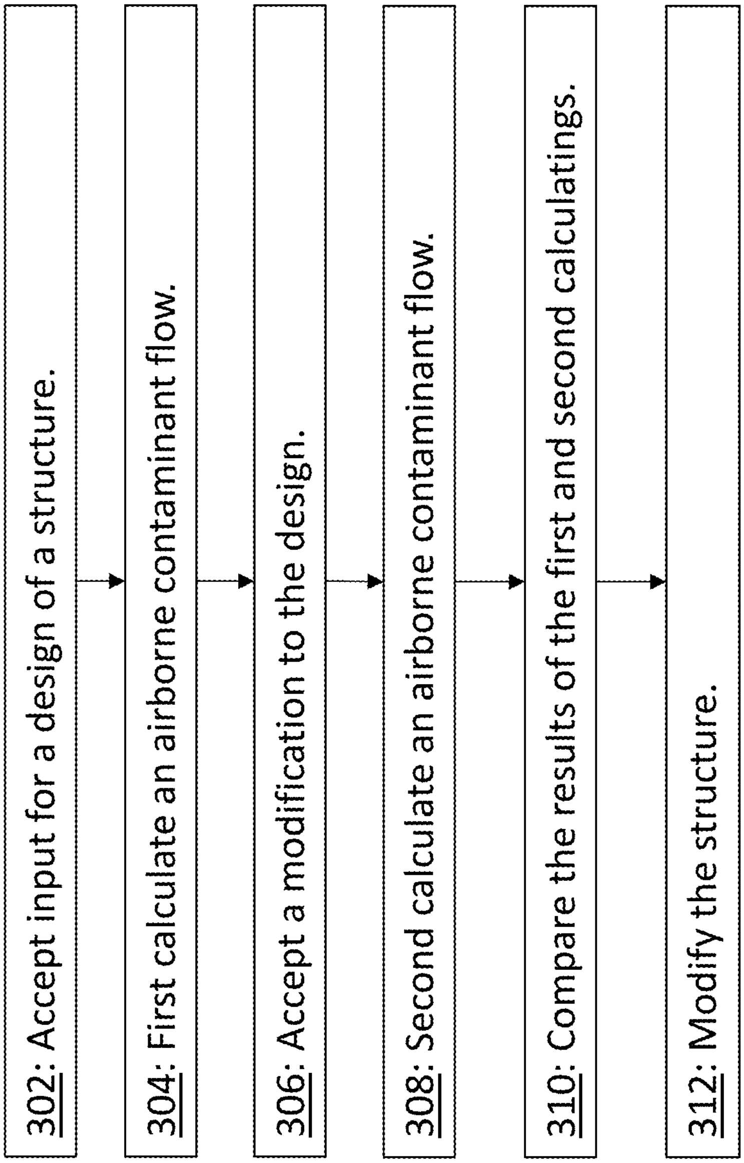
FIG. 3 is a flowchart of a representative method for modifying an architectural structure.
Figure 4B:
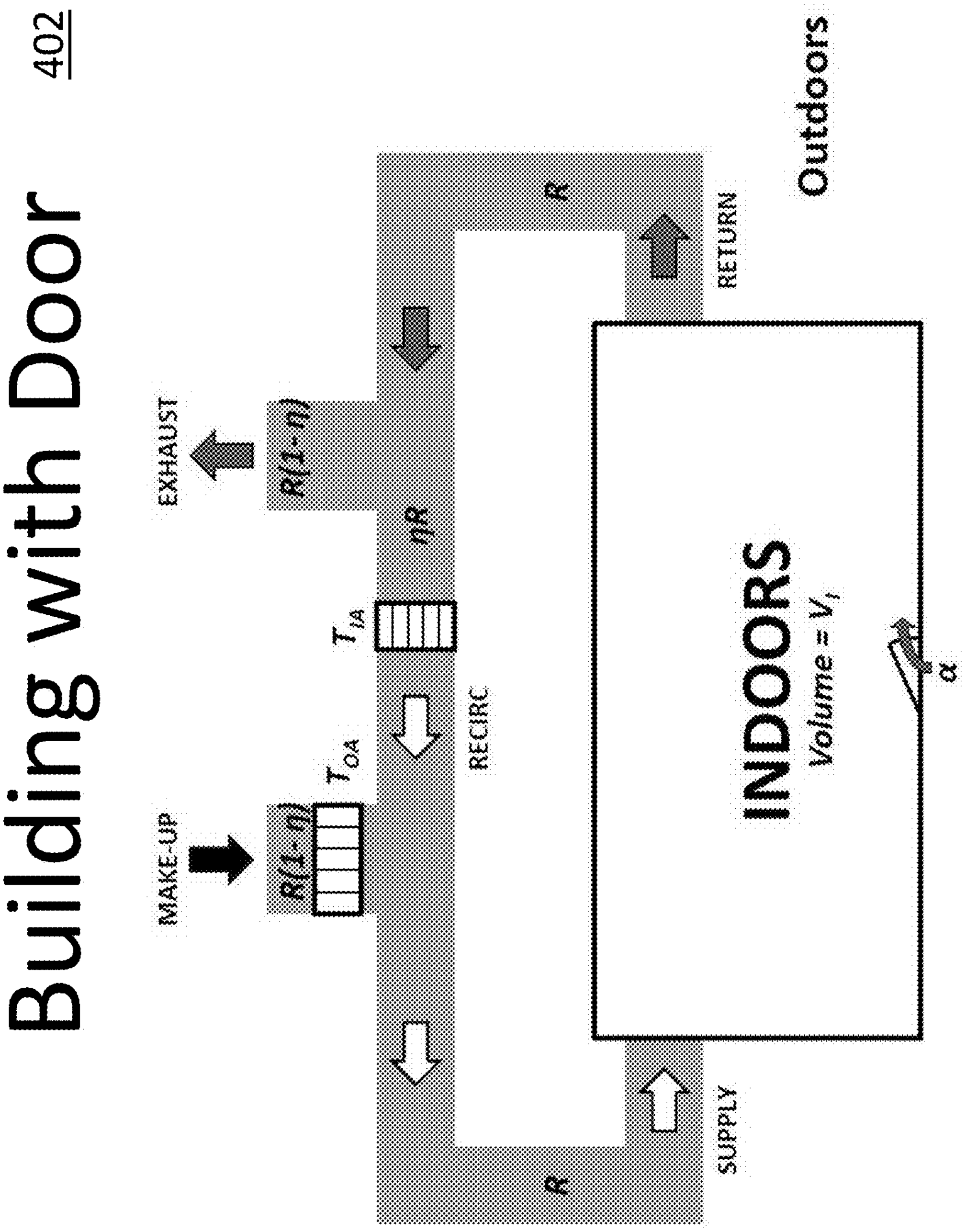
Figure 4C:
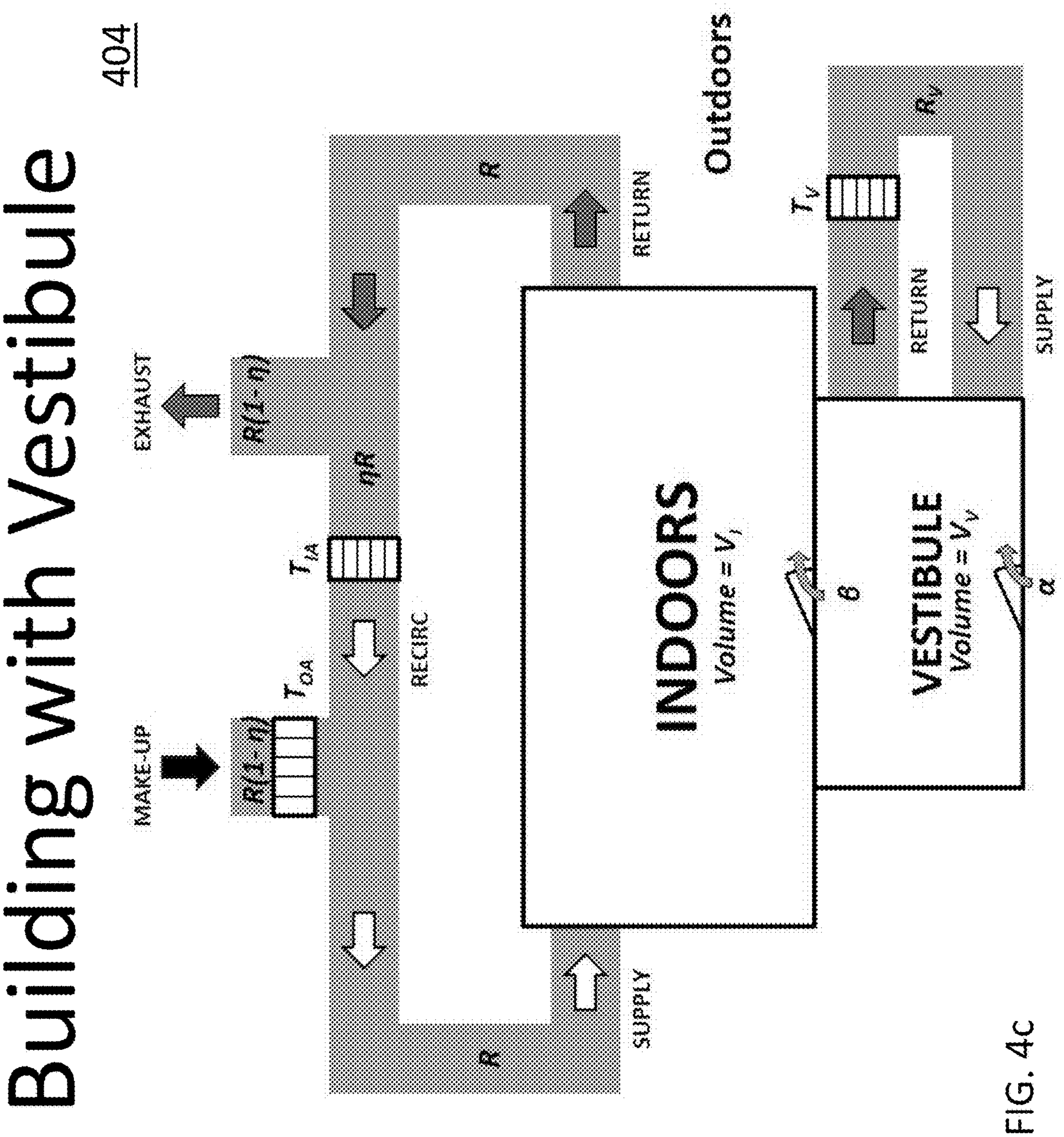

The flowchart of FIG. 3 presents an exemplary method 300 for modifying an existing architectural structure. As this method is very similar to the method 200 for designing a new structure (FIG. 2), very little more needs be said. For older structures, the design information submitted to the CAD system 100 in step 302 may not be readily available, and this step 302 may necessitate extensive scanning and measuring of the existing structure and even after-the-fact reconstruction of hidden elements or outdated construction techniques. Of importance to the current discussion, these reconstruction techniques may provide inaccurate data that adversely affect the quality of the airflow calculations performed in steps 304 and 308. The re-designer should be aware of this possible source of inaccuracy and should be able to account for it, for example, by conservatively over-specifying any HVAC upgrades to the existing structure.

Also, existing structures may impose significant constraints that do not exist for new structures. As just one instance, there may be limits to how the appearance of a historically significant building can be changed, even for changes that improve the quality of the internal air.

By bringing airflow calculations into the heart of the design process, the above procedures make a great advance over traditional techniques that treat airflow calculations as an added validation made only at the end of the design process. The designer can now experiment with various airflow scenarios and then specify an HVAC system appropriately scaled for the structure being designed. Presenting the designer with timely, accurate airflow analysis can save substantial initial and ongoing costs over the traditional step of wildly over-specifying the HVAC system to ensure safe operation.

Notes on a Closed-Form Solution for Airborne Contaminant Flows

As mentioned above, airborne contaminant-flow problems are often stated in terms of systems of ordinary differential equations which can be addressed by matrix-inversion methods.

Traditionally, many problems requiring matrix inversion are addressed using either computer algebra systems or numerical approximations and simulations. Numerical solutions usually require that all algebraic variables lee substituted with specific numbers, so that an individual program run yields a single specific numerical result. Understanding how this numerical answer varies with a change in system variables requires many program runs. Moreover, numerical methods use floating-point numbers which are subject to errors when a computer attempts to handle both very large and very small numbers simultaneously.

Computer algebra systems, although avoiding the vagaries associated with floating-point representation, are exceptionally complex as they need to handle a large variety of functions: linear, trigonometric, transcendental, etc, They also require a large rule-base of algebraic manipulations.

Fortunately, recent advances in the field have begun to yield closed-form solutions for many airborne contaminant scenarios. This note details a few such solutions. For another, complementary, analysis, see the article by M. D. Ginsberg & A. T. Bui entitled "Bioprotection of Facilities," Defense & Security Analysis (2015).

Consider the general formulation of an ordinary differential equation used to describe a dynamical system. In the time domain, this problem description is to study the time evolution of a signal y(t) as a function of the time-varying signal u(t). As a convention, the bold typeface means vector or matrix (depending on context). In the time domain, let x be a column vector of time-varying signals $x(t)=[x_1(t), x_2(t), \ldots, x_n(t)]^T$. Let y(t) and u(t) be the time-varying scalar output and input (respectively) of the system. Let F be a square, constant, state-matrix of n×n.

A canonical example is given here in frequency space:

$$sX(s)=FX(s)+GU(s)$$

$$Y(s)=HX(s) \tag{1}$$

where X(s) is Laplace transform of x(t) as given earlier. Analogously, U(s) is an exogenous input, and Y(s) is an output of interest. F is a state-matrix; G and H are vectors. For simplicity, F, G, and H contain constants. One can easily ask for the "transfer function" of the system (how the input, maps to the output). Using the notation I as the identity matrix, the formal solution is:

$$\frac{Y(s)}{U(s)} = H(sI-F)^{-1}G \tag{2}$$

Notice this requires calculating the matrix inverse $(sI-F)^{-1}$. As the number of states n increases, this matrix grows as $n^2$. This can easily exhaust computational resources if carried out with numerical methods or with standard computer algebra methods (e.g., by using Cramer's rule or similar).

To continue fleshing out this idea, consider this equation worked out for a two-state system:

$$\begin{bmatrix} \dot{x}_1(t) \\ \dot{x}_2(t) \end{bmatrix} = \begin{bmatrix} a & b \\ c & d \end{bmatrix} \begin{bmatrix} x_1(t) \\ x_2(t) \end{bmatrix} + \begin{bmatrix} e \\ f \end{bmatrix} u(t) \tag{3}$$

$$y(t) = [g\ h] \begin{bmatrix} x_1(t) \\ x_2(t) \end{bmatrix}$$

Figure 7:
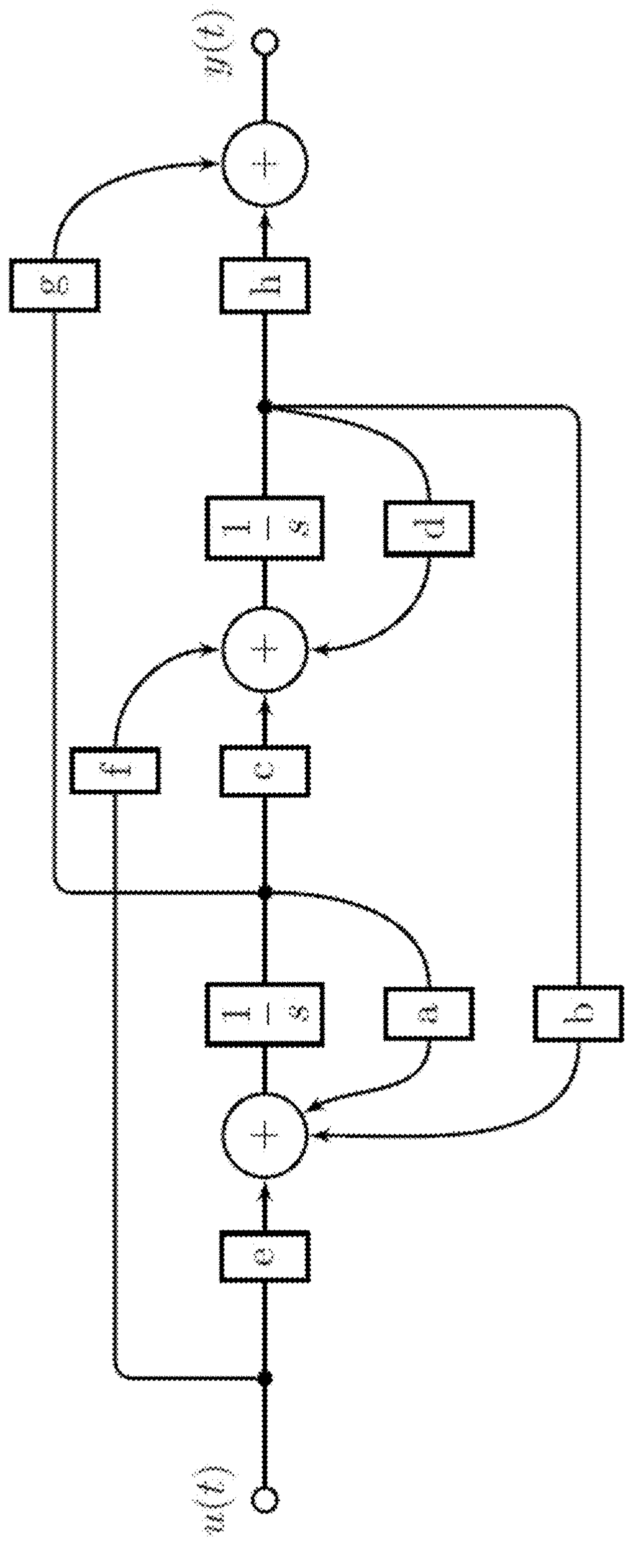
FIG. 7 is an all integrator block diagram.

Note that this is equivalent to the "all integrator block diagram" shown in FIG. 7.

To solve Equation (3) by hand, use Equation (2):

$$(sI-F)^{-1} = H(sI-F)^{-1}GU(s) \tag{4}$$

$$= [g\ h] \begin{bmatrix} s-a & -b \\ -c & s-d \end{bmatrix}^{-1} \begin{bmatrix} e \\ f \end{bmatrix} \tag{5}$$

$$= \left( \frac{egs - \deg + bfg + ceh + fhs - afh}{(s-a)(s-d) - bc} \right) \tag{6}$$

$$= \left( \frac{egs - \deg + bfg + ceh + fhs - afh}{s^2 - s(a+d) + ad - bc} \right) \tag{7}$$

Using software, a simple gain evaluation by inspection produces:

$$\frac{Y(s)}{U(s)} = \frac{egs - \deg + fhs + ahf + ceh + bfg}{s^2 - as - ds - bc + ad} \quad (8)$$

Carefully comparing Equations (7) and (8) shows that this is the required result.

At first blush, the preceding calculations merely yielded the transfer function:

$$\frac{Y(s)}{U(s)}$$

What happened to the promised inverse matrix $(sI-F)^{-1}$? A key realization here is that the vectors G and H play no role in the inverse. Hence they could be assigned any value which might be helpful. For instance, the choice: $G=[e,f]^T=[1,0]$ and $H=[g,h]=[1,0]$ picks off the first row and first column of $(sI-F)^{-1}$. Carrying this idea further, G and H can be set to values that pick off the desired row and column of $(sI-F)^{-1}$, respectively. Therefore the transfer function given by Equation (8) contains complete information about the inverse matrix $(sI-F)^{-1}$. For clarity's sake, now carry this out both by hand calculation starting with F and then compare the result to substituting selected variables (namely e, f, g, and h) into the transfer function of Equation (8). Hence:

$$(sI-F)^{-1} = \begin{bmatrix} s-a & -b \\ -c & s-d \end{bmatrix}^{-1} \quad (9)$$

$$= \left(\frac{1}{(s-a)(s-d)-bc}\right)\begin{bmatrix} s-d & b \\ c & s-a \end{bmatrix} \quad (10)$$

$$= \begin{bmatrix} \left(\frac{s-d}{s^2-as-ds+ad-bc}\right) & \left(\frac{b}{s^2-as-ds+ad-bc}\right) \\ \left(\frac{c}{s^2-as-ds+ad-bc}\right) & \left(\frac{s-a}{s^2-as-ds+ad-bc}\right) \end{bmatrix} \quad (11)$$

So, for example, substituting e=1, f=0, g=1, h=0 into Equation (8) yields the row 1, column 1 term in Equation (11) as stated earlier. The following equations can be seen by careful inspection of Equations (8) and (11) because the denominators are equal to one another and invariant with respect to the variables e, f, g, and h. Hence:

$$\frac{Y(s)}{U(s)}\Big|_{\substack{e=1,f=0\\ g=1,h=0}} = \frac{s-d}{s^2-as-ds+ad-bc} \quad (12)$$

$$\frac{Y(s)}{U(s)}\Big|_{\substack{e=0,f=1\\ g=1,h=0}} = \frac{b}{s^2-as-ds+ad-bc} \quad (13)$$

$$\frac{Y(s)}{U(s)}\Big|_{\substack{e=1,f=0\\ g=0,h=1}} = \frac{c}{s^2-as-ds+ad-bc} \quad (14)$$

$$\frac{Y(s)}{U(s)}\Big|_{\substack{e=0,f=1\\ g=0,h=1}} = \frac{s-a}{s^2-as-ds+ad-bc} \quad (!5)$$

again proving the equivalence of information stored in Equation (8) by careful selection of the extra vectors G and H.

There are strategic ways in which the system can be made more complicated, yet yield enough additional information that the additional complexity is worth accepting.

As shown above, the free variables of the vectors G and H allowed the method to read the inverse matrix element-by-element after calculating a single transfer function. This process can be understood by imagining the vectors G and H as being like oscilloscope probes making contact with the system at two points, one being interpreted as an input node and the other as an output node. Thus, substitute the value "1" both where a probe touches the input node (in the vector G) and where a probe touches the output node (in the vector H). All other components of G and H are set to zero.

Although these extra variables make the system more complicated, and can quickly push the calculations beyond the capability of a human, they are easily handled by a computer and yield the complete inverse matrix.

A formal proof of this property would require an extra signal input, call it $i_m(t)$ for "meta" input, and a meta output $o_m(t)$. There would be two extra vectors, $G_m$ and $H_m$ each of which has connections to each node of the circuit, where node is defined as: input signal, output signal, summing output, integrator input, and integrator output. Any of these nodes may be redundant if connected to another node with no intervening transmittance or sum. In the example, this is six nodes: input, output, and either side of each integrator.

Some matrices do not have an inverse; they are said to be singular. Further, some matrices may represent a system diagram with unusual characteristics. As an example, the resulting diagram may represent two or more non-connected system diagrams. In general, any of these situations could cause the "gain evaluation by inspection" method to produce nonsense answers. However, the complexity of the matrix may be increased by adding new "conditioning" variables and connections that condition the matrix to have desirable properties. Elements of the resulting inverse matrix can be taken when these variables are driven to a specific limit that removes their effect from the final solution. As an example, one could add connections at a transmittance of t that assure a path from the input to the output. The inverse matrix can then be subject to taking a limit as t goes to zero, thus erasing the new connection from the problem altogether.

By strategic use of conditioning variables, connections are added to the system diagram in a manner that may increase the complexity of the system diagram beyond any hope of human analysis. However, any pathology exhibited by the original matrix does not appear until limits are taken of the individual terms of the resulting inverse matrix. This is an intrinsically much simpler method to manage than existing numerical approximations to taking a matrix inverse.

A typical numerical approximation to taking an inverse can lead to the computer having to handle numerical quantities, some of which may be huge where others are tiny, or can lead to other pathological conditions that do not translate well to a computer's method of interpreting real numbers. The method described above, by keeping all results strictly algebraic, neatly skips over any of these problems until the end of the calculation. Once that point is reached, all of the resulting matrix entries are far easier to handle as individual expressions.

In some situations, better performance may be achieved by swapping Mason's Gain Formula for another standard method. Two likely candidates are the Samuelson-Berkowitz Method (a.k.a. "Berkowitz's algorithm") and the Bereiss' Method.

The motivation to use these two methods is straightforward. Brute-force methods of matrix inversion (the most ubiquitous of which is Cramer's Rule) have a huge drawback. Although they arrive at the correct algebraic expression, the numerator and denominator generated can have a large number of canceling terms. This defeats the purpose of being free from an underlying computer algebra system. Indeed finding such cancelling terms adds needless computing time.

The need to invert a matrix and then avoid cancelling dividing terms has been looked at previously under another guise: when the matrix elements yield "characteristic polynomials over any commutative ring." Luckily, the algorithms by Bereiss and Berkowitz are considered computationally efficient, and further, they are easily implemented for parallel computers. Hence, some implementations may use one or the other of these methods when inventing the (sI−F) matrix.

Unless explicitly stated otherwise, each numerical value and range should be interpreted as being approximate as if the word "about" or "approximately" preceded the value or range.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the testing measurements.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

All documents mentioned herein are hereby incorporated by reference in their entireties or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In view of the many possible embodiments to which the principles of the present discussion may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

I claim:

1. A system comprising:

an intelligent HVAC controller configured to control an HVAC structure in an architectural structure containing air;

a sensor configured to detect a contaminant in the air inside the architectural structure;

an airborne contaminant flow calculator configured to determine airborne contaminant flow inside the architectural structure using a closed-form solution for calculating airflow;

the intelligent HVAC controller configured to alter airflow in the architectural structure to reduce concentrations of the contaminant in the air of the architectural structure based on the determined airborne contaminant flow;

the intelligent HVAC controller configured to receive design information of a design of the architectural structure;

a suggestion module configured to make a suggestion for improving the design of the architectural structure;

the airborne contaminant flow calculator configured to graph a protection factor for the architectural structure with a door in a first location; and the suggestion module configured to suggest a different location for a door to improve the protection factor.

2. The system of claim 1 comprising: a computer-aided design (CAD) system configured to:

receive design information about the architectural structure;

receive designer submissions through an input device; the designer submission comprising structural information about the architectural structure;

display design progress of the architectural structure on a computer screen;

perform calculations to ensure updated design of the architectural structure meets structural standards; and create a model showing how air is expected to flow throughout the architectural structure.

3. The system of claim 1 wherein the airborne contaminant flow calculator is configured to graph a protection factor as a function of a fraction of recirculated air.

4. The system of claim 3 wherein the protection factor is a measure of how well the system can protect its occupants from the contaminant.

5. The system of claim 1 wherein the airborne contaminant flow calculator is configured to include rate of ventilation, fraction of air recirculated, transmittance of a connected outdoor air filter, transmittance of an indoor air filter, and volume of interior dimensions of the architectural structure in its calculations for graphing protection factor as a function of a fraction of recirculated air.

6. The system of claim 1 wherein the airborne contaminant flow calculator is configured to include current leakage rate due to a vestibule door in a vestibule, rate of ventilation in the vestibule, transmittance of a vestibule air filter, and volume of the vestibule in its calculations for graphing protection factor as a function of a fraction of recirculated air.

7. The system of claim 1 wherein the suggestion module is configured to:

base a suggestion to the design of the architectural structure based on calculations from the airborne contaminant flow calculator; and increase air-conditioning capacity when an increase in architectural structure occupancy is entered into a computer-aided-design system.

8. The system of claim 1 wherein the intelligent HVAC controller is configured to dilute concentration of the contaminant in the air of the architectural structure.

9. The system of claim 1 wherein the intelligent HVAC controller is configured to close a shutter in an air duct.

10. The system of claim 1 wherein the intelligent HVAC controller is configured to turn up a fan.

11. The system of claim 1 wherein the intelligent HVAC controller is configured to redirect airflow to a standby filtration system.

12. The system of claim 1 wherein the intelligent HVAC controller is configured to divert the contaminant in the air away from occupants of the architectural structure.

13. The system of claim 1 wherein the intelligent HVAC controller is configured to manipulate an HVAC element.

14. The system of claim 13 wherein the HVAC element is selected from the group consisting of: a valve, a shutter, a window, a door, a hatch, a fan, and a filtration unit.

15. The system of claim 13 wherein the HVAC element is an alert interface configured to display alert information selected from the group consisting of: an audible alert, a visible alert, a text alert, and safety instructions.

16. The system of claim 13 wherein the HVAC element is an alert interface configured to provide a suggestion for manipulating the HVAC element.

17. A method comprising:

detecting a contaminant in air inside an architectural structure;

determining an airborne contaminant flow using a closed-form solution for calculating airflow in the architectural structure;

altering airflow inside the architectural structure using an intelligent HVAC controller;

the architectural structure comprising an HVAC structure; the HVAC structure comprising an indoor air filter in a primary loop and an emergency air filter in an emergency loop;

the intelligent HVAC controller determining that filtration performance of the primary loop to be insufficient to remove the contaminant from the air based on the determined airborne contaminant flow;

the intelligent HVAC controller diverting internal air into the emergency loop based on the determined airborne contaminant flow to control concentration of the contaminant, the intelligent HVAC controller receiving design information of a design of the architectural structure making a suggestion for improving the design of the architectural structure using a suggestion module;

graphing a protection factor for the architectural structure with a door in a first location; and the suggestion module suggesting a different location for a door to improve the protection factor.

18. The method of claim 17 wherein the intelligent HVAC controller diverts internal air by opening a shutter and turning on a fan.

19. The method of claim 17 wherein the emergency air filter has a higher MERV (minimum efficient reporting value) than the indoor air filter.

20. The method of claim 17 wherein the emergency air filter is a HEPA (high-efficiency particulate air) filter.

21. A method comprising:

detecting a contaminant in air inside an architectural structure;

determining an airborne contaminant flow using a closed-form solution for calculating airflow in the architectural structure;

an intelligent HVAC controller altering airflow inside the architectural structure to reduce concentrations of the contaminant in the air of the architectural structure by manipulating an HVAC element based on the determined airborne contaminant flow;

the intelligent HVAC controller receiving design information of a design of the architectural structure;

making a suggestion for improving the design of the architectural structure using a suggestion module;

graphing a protection factor for the architectural structure with a door in a first location; and the suggestion module suggesting a different location for a door to improve the protection factor.

22. The method of claim 21 comprising:

receiving design information about the architectural structure with a computer-aided design (CAD) system;

receiving designer submissions through an input device; the designer submission comprising structural information about the architectural structure;

displaying design progress of the architectural structure on a computer screen;

performing calculations to ensure updated design of the architectural structure meets structural standards; and creating a model showing how air is expected to flow throughout the architectural structure.

23. The method of claim 21 comprising graphing a protection factor as a function of a fraction of recirculated air.

24. The method of claim 21 comprising:

basing a suggestion to the design of the architectural structure on calculations of the determining an airborne contaminant flow; and increasing air-conditioning capacity when an increase in architectural structure occupancy is entered into a computer-aided-design system.

25. The method of claim 21 comprising displaying alert information via an alert interface.

26. The method of claim 25 comprising triggering an audible alert or visible alert.

27. The method of claim 25 comprising generating a suggestion for manipulating the HVAC element.

28. The method of claim 27 wherein the HVAC element is selected from the group consisting of: a valve, a shutter, a window, a door, a hatch, a fan, and a filtration unit.

29. The method of claim 21 wherein altering airflow comprises diluting concentration of the contaminant in the air of the architectural structure.

30. The method of claim 21 wherein altering airflow comprises changing airflow through the HVAC structure by closing a shutter in an air duct.

31. The method of claim 21 wherein altering airflow comprises changing airflow through the HVAC structure by turning up a fan.

32. The method of claim 21 wherein altering airflow comprises changing airflow through the HVAC structure by redirecting airflow to a standby filtration system.

33. The method of claim 21 wherein altering airflow comprises diverting the contaminated air away from occupants of the architectural structure.

* * * * *